United States Patent [19]

Ishiuchi

[11] Patent Number: 4,731,342
[45] Date of Patent: Mar. 15, 1988

[54] METHOD OF MANUFACTURING A MEMORY CELL FOR A DYNAMIC TYPE RANDOM ACCESS MEMORY

[75] Inventor: Hidemi Ishiuchi, Fujisawa, Japan

[73] Assignee: Kabushiki Kaisha Toshiba, Kawasaki, Japan

[21] Appl. No.: 901,520

[22] Filed: Aug. 28, 1986

[30] Foreign Application Priority Data

Aug. 30, 1985 [JP] Japan ................................ 60-191573

[51] Int. Cl.⁴ ......................................... H01L 21/425
[52] U.S. Cl. ....................................... 437/48; 427/52; 437/52
[58] Field of Search ...................... 29/571, 576 B, 578; 148/187

[56] References Cited

U.S. PATENT DOCUMENTS

| | | | |
|---|---|---|---|
| 4,327,476 | 5/1982 | Iwai et al. | 29/571 |
| 4,353,086 | 10/1982 | Jaccodine | 29/580 X |
| 4,435,896 | 3/1984 | Parillo et al. | 29/571 |
| 4,455,740 | 6/1984 | Iwai | 29/580 X |
| 4,577,395 | 3/1986 | Shibata | 29/571 X |
| 4,598,460 | 7/1986 | Owens et al. | 29/576 B |
| 4,613,885 | 9/1986 | Haken | 29/576 B |
| 4,637,836 | 1/1987 | Flatley et al. | 148/187 X |
| 4,646,425 | 3/1987 | Owens et al. | 29/571 |

OTHER PUBLICATIONS

Hashimoto et al., "Counterdoped Well Structure for Scaled CMOS", Technical Digest of International Electron Devices Meeting (IEDM), 1982, pp. 470–473, Dec. 1982.

Meguro et al., "Hi-CMOS III Technology", Technical Digest of International Electron Devices Meeting (IEDM), 1984, pp. 59–62, Dec. 1984.

*Primary Examiner*—George T. Ozaki
*Attorney, Agent, or Firm*—Finnegan, Henderson, Farabow, Garrett & Dunner

[57] ABSTRACT

A method of manufacturing a MOS semiconductor device which comprises a first step of forming a p-type well region in the surface of an n-type silicon substrate, a second step of forming a field oxide layer surrounding part of the surface of the well region, a third step of ion-implanting a n-type impurity into the surface of the well region, to reduce the carrier density of the well region in the vicinity of the ion-implanted without changing the conductivity type of the well region, a fourth step of forming a gate electrode insulatively on the ion-implanted surface of the well region, and a fifth step of forming the n⁺-type source and drain regions in the ion-implanted surface of the well region. The third step of this manufacturing method uses the field oxide layer for implanting the n-type impurity, as a mask.

3 Claims, 15 Drawing Figures

F I G. 3A
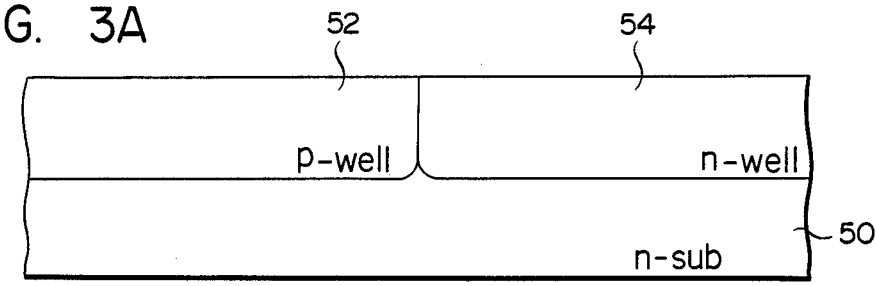
F I G. 3B
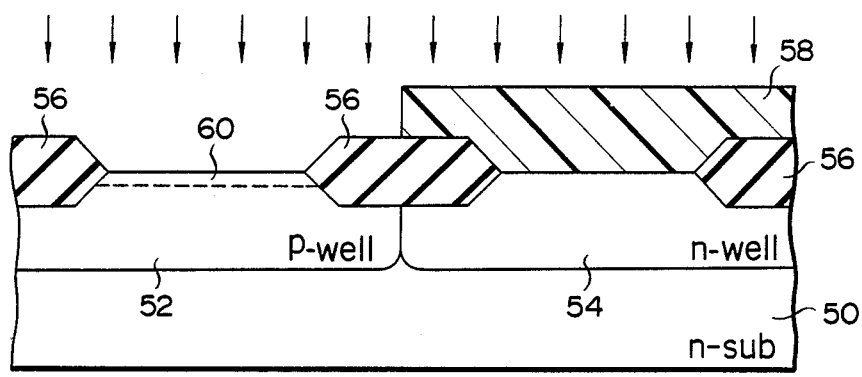
F I G. 3C
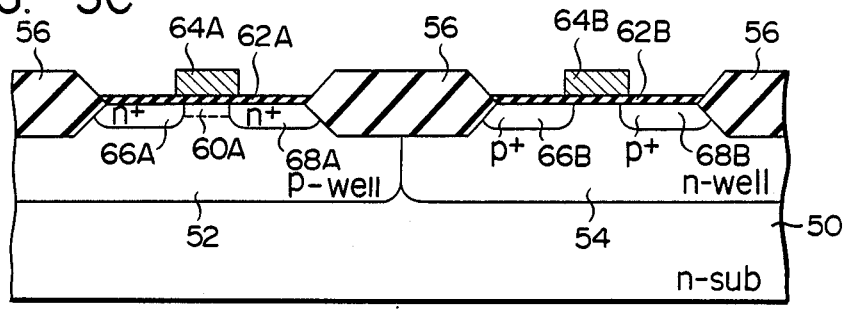

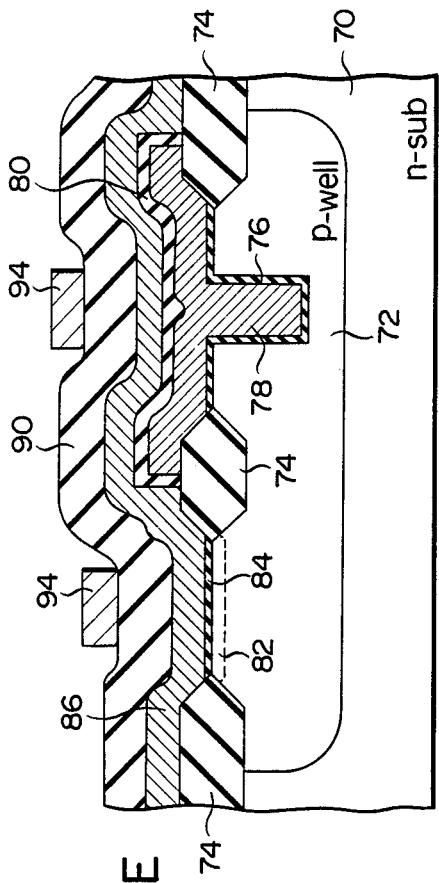
F I G. 4E
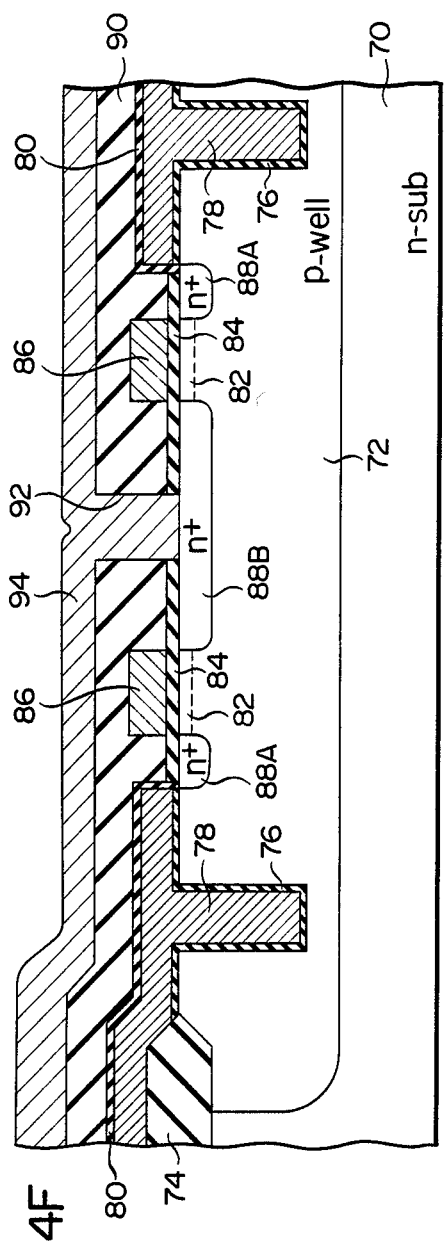
F I G. 4F

METHOD OF MANUFACTURING A MEMORY CELL FOR A DYNAMIC TYPE RANDOM ACCESS MEMORY

BACKGROUND OF THE INVENTION

The present invention relates to a method of manufacturing a MOS semiconductor device and, more particularly, to a method of manufacturing a MOS integrated semiconductor device.

In the manufacture of a MOS transistor, a diffusion region (or a well region) may sometimes be formed in the surface area of a semiconductor substrate, in order to facilitate the control of MOS transistor's characteristics. The source and drain regions of the MOS transistor are formed in the surface area of the well region. The threshold voltage of the MOS transistor varies in response to the impurity concentration (or carrier density) of a channel region between the source and drain regions. It is already known that the characteristics of the MOS transistor are improved when the impurity concentration of the well region decreases in the vicinity of the surface.

In the conventional method of manufacturing a number of MOS transistors, there are disadvantages, as will be described, in the integration of the MOS transistors in a single semiconductor substrate. In the integration, a field oxide layer is used to electrically separate the MOS transistors sufficiently from each other.

The conventional method of manufacturing MOS transistors will now be described with reference to FIGS. 1A to 1C. In FIGS. 1A to 1C, the formation of a MOS transistor is shown for simplicity of description, but a plurality of MOS transistors are actually formed simultaneously through the steps of FIGS. 1A to 1C. In the manufacturing method, n-type silicon substrate 10, for example, is initially prepared, and resist pattern 12 is then formed thereon. Then, a p-type impurity is ion-implanted into substrate 10, using pattern 12 as a mask, and further activated by annealing in order to form p-type well region 14. After the formation of well region 14, the n-type impurity is ion-implanted into region 14, using pattern 12 as a mask, thereby forming ion-implanted region 14A, as shown in FIG. 1A. Region 14A has a reduced carrier density in the vicinity of the surface of region 14, without inverting the conductivity type.

Field oxide layer 16, shown in FIG. 1B, is formed by the selective thermal oxidation of the surfaces of substrate 10 and region 14 after the step of FIG. 1A. Layer 16 surrounds part of the surface of region 14. The surrounded part is used as an element region. The exposed surface of region 14 is covered with gate oxide film 18. Gate electrode 20, shown in FIG. 1C, is formed on film 18. After the formation of electrode 20, then n-type impurity is further ion-implanted into region 14, using electrode 20 and layer 16 as masks, as shown in FIG. 1C. The implanted impurity is then activated by annealing, thereby forming n+-type source and drain regions 22A and 22B, as shown in FIG. 1C. Thus, the formation of the MOS transistor is completed.

In the aforementioned manufacturing method, resist pattern 12 is commonly utilized in the ion implantation process, for forming p-type well 14, and for forming ion-implanted region 14A. Thus, when field oxide layer 16 is formed, the n-type impurity in region 14A is thermally diffused. This diffusion undesirably reduces the carrier density of that part of region 14 which is located directly under layer 16. In this case, layer 16 cannot sufficiently insulate the MOS transistors from each other. More specifically, since the wiring layers of the MOS transistors are formed above layer 16, if the carrier density directly under layer 16 is decreased, an significant amount of leakage current may flow, due to an electric field emitted from the wiring layers.

Further, the n-type impurity in region 14A is exceedingly diffused by heat during the formation of layer 16. Therefore, it is difficult to set the channel length of the MOS transistors to be sufficiently short.

SUMMARY OF THE INVENTION

An object of the present invention is to provide a method of manufacturing a MOS semiconductor device suitable for microminiaturizing MOS elements, by sufficiently reducing the carrier density of the surface of a desired element region without deteriorating field insulation properties.

According to the present invention, there is provided a method of manufacturing a MOS semiconductor device comprising the first step of forming a well region of a first conductivity type in the surface of a semiconductor substrate; the second step of forming a field insulating layer surrounding part of the surface of the well region, as an element region; the third step of doping an impurity of a second conductivity type into the surface of the well region with the use of the field insulating layer as a mask, thereby reducing the carrier density of the well region in the vicinity of the surface without changing the conductivity type of the well region; the fourth step of forming a gate electrode insulatively on the impurity-doped surface of the well region; and the fifth step of forming the second conductivity type source and drain regions in the surface of the well region.

BRIEF DESCRIPTION OF THE DRAWINGS

FIGS. 3A to 3C are views showing the steps of manufacturing CMOS transistors according to a second embodiment of the present invention; and FIGS. 4A to 4F are views showing the steps of manufacturing memory cells of a dynamic RAM according to a third embodiment of the present invention.

DETAILED DESCRIPTION OF THE PREFERRED EMBODIMENTS

Figure 1A:
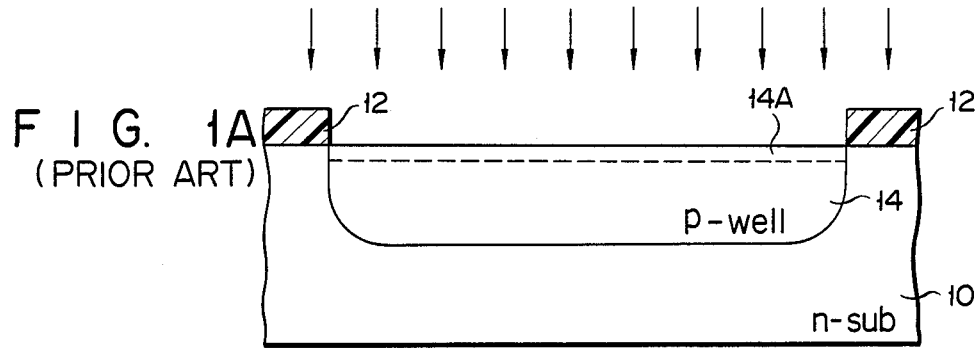
FIGS. 1A to 1C are views showing the conventional manufacturing steps of a MOS transistor.
Figure 1B:
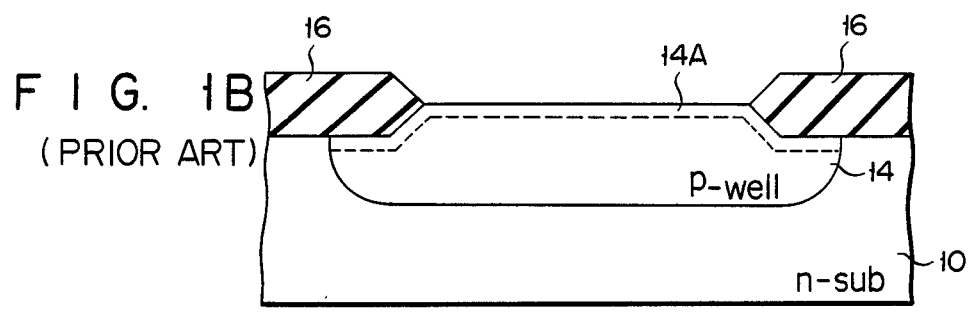
Figure 1C:
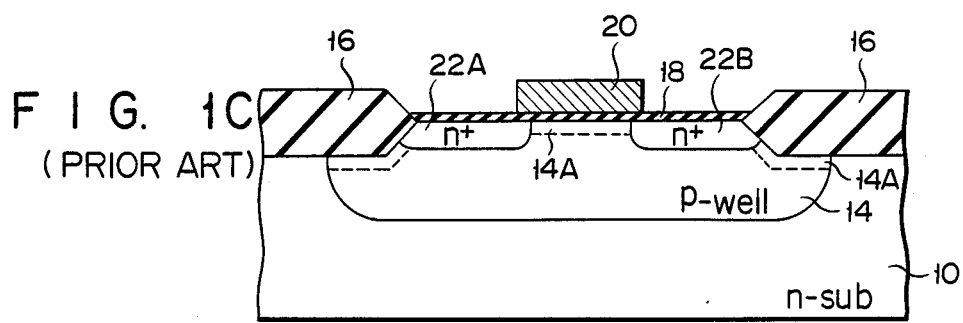
Figure 2A:
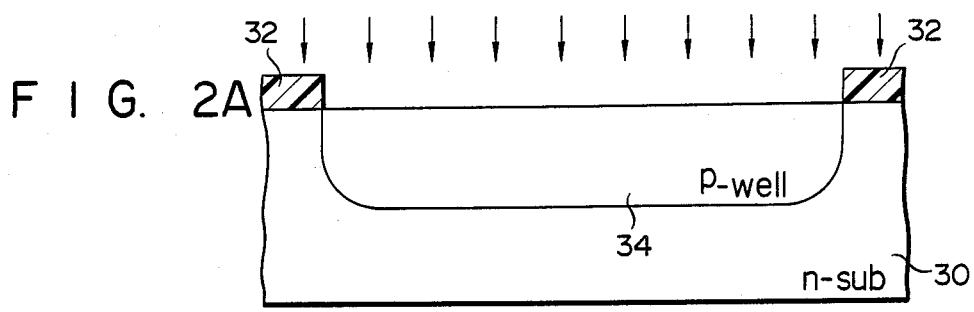
FIGS. 2A to 2C are views showing the steps of manufacturing a MOS transistor according to one embodiment of the present invention.

A first embodiment of the present invention will now be described with reference to FIGS. 2A to 2C, which show the steps of manufacturing an n-channel MOS transistor. In the manufacture of the MOS transistor, n-type silicon substrate 30 having 1 Ω·cm of specific resistance is prepared. Resist pattern 32, shown in FIG. 1A, is formed on substrate 30. Then, a p-type impurity, such as boron, is ion-implanted into the unmasked surface of substrate 30, using pattern 32 as a mask. Substrate 30 is heat-treated at 1100° C. after the ion implantation. The implanted impurity forms p-type well region 34 having a density of about $10^{-17}$ cm$^{-3}$ as the result of the heat treatment.

Pattern 32 is removed after well region 34 has been formed. Field oxide layer 36, shown in FIG. 2B, is formed by selectively oxidizing the surfaces of substrate 30 and region 34. In this oxidation, substrate 30 and layer 34 are heated at 1000° C. The thickness of layer 36 is set to 8000 Å near the boundary between substrate 30 and region 34. Layer 36 overhangs from the surface of substrate 30 toward the outer periphery of the surface of region 34, thereby surrounding the remainder of the surface of region 34, as an element region.

Figure 2B:
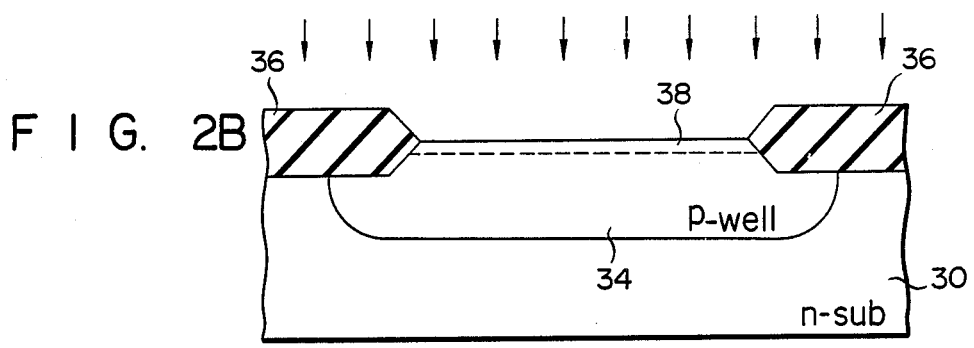

After layer 36 is formed, an n-type impurity, such as phosphorus, is ion-implanted into the exposed surface of region 34, using layer 36 as a mask, to form ion-implanted region 38, shown in FIG. 2B. The dosage and accelerating energy of the phosphorus are selected to values whereby the conductivity of region 34 is not changed by ion implantation of the n-type impurity at the position corresponding to region 38. Here, ion implantation is executed, for example, by dosage of $5 \times 10^{11}$ cm$^{-2}$ and an accelerating energy of 100 keV. The carrier (hole) density of region 34 is sufficiently reduced in the vicinity of the exposed surface by implanting n-type impurity (phosphorus) ions. The phosphorus ions cannot pass through layer 36 due to this layer's thickness. Thus, the carrier density of region 34 does not decrease directly under layer 36. In other words, the carrier density of this portion is maintained at the same value as that when region 34 was formed.

Figure 2C:
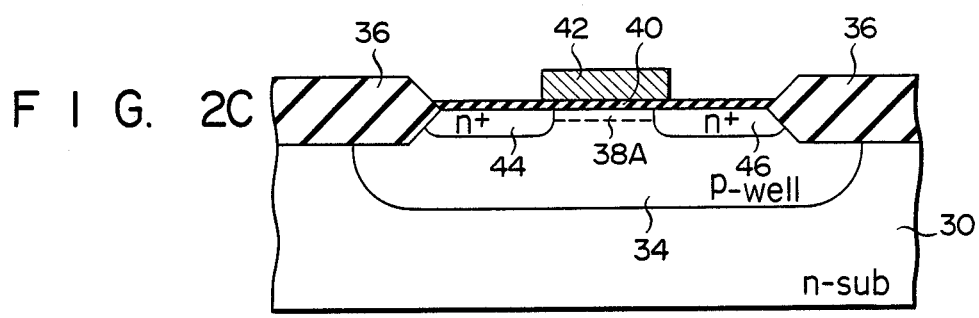

After region 38 is formed, gate oxide film 40 of 200 Å thick is formed on the exposed surface of region 34 by thermal oxidizing, as shown in FIG. 2C. Then, phosphorus-doped polycrystalline silicon is entirely deposited on layer 36 and film 40, to form a phosphorus-doped polycrystalline silicon film, (not shown). This film is selectively removed by patterning, and the part shown in FIG. 2C is left as gate electrode 42.

After gate electrode 42 is formed, an n-type impurity, such as arsenic, is ion-implanted into region 34 and 38, using layer 36 and electrode 42 as masks. Arsenic ions pass through film 40, during the implantation, to arrive at region 34. After the ion implantation, substrate 30 is annealed, to form source and drain regions 44 and 46 of high impurity density, as shown in FIG. 2C. Part of region 38 forms channel region 38A between source and drain regions 44 and 46, as shown in FIG. 2C. The formation of an n-channel MOS transistor is completed, as described above.

When wiring the MOS transistor, an interlayer insulating film (not shown) is formed by deposition on the exposed portion of layer 36, film 40, and electrode 42. The interlayer film is selectively perforated with openings for exposing, for example, source and drain regions 44 and 46. Then, a metal layer (not shown) is formed by deposition on an interlayer insulating layer in contact with the exposed portions of regions 44 and 46. The openings of the interlayer film are used as contact holes, at this time. Then, the metal layer is patterned. In the patterning, the metal layer is selectively removed from the interlayer insulating film, except for the portion necessary for wiring.

According to the method of manufacturing the MOS transistor as described above, layer 38 is formed by ion implantation, after forming layer 36, and by using layer 36 as the mask. Since layer 36 can completely prevent an n-type impurity from implanting itself into region 34, the carrier density of region 34 does not decrease directly under the well region. Therefore, the deterioration of the field-insulating characteristic between MOS transistors can be reliably prevented. Further, the field-insulating characteristic does not depend upon the n-type impurity concentration in region 38. Thus, the carrier density in region 38 can be controlled independently to an optimum value.

Further, region 38 is formed after the heat-treating step of forming layer 36. Therefore, the impurity in region 38 is not undesirably diffused by the heat-treatment. This contributes to the microminiaturization of the MOS transistor.

A second embodiment of the present invention will now be described with reference to FIGS. 3A to 3C, which show the manufacturing steps of CMOS transistors. In the manufacturing of the CMOS transistors, n-type silicon substrate 50 of 1 Ω·cm of specific resistance is prepared. P-type well region 52 and n-type well region 54, shown in FIG. 3A, are respectively formed in the surface of substrate 50.

After well regions 52 and 54 are formed, their surfaces are selectively oxidized. Field oxide layer 56, shown in FIG. 3B, is formed in a thickness of about 8000 Å by the oxidation, to surround part of each surface of regions 52 and 54, as an element area. Then, photoresist pattern 58 is formed, as shown in FIG. 3B. The entire exposed surface of region 54 is covered with pattern 58.

After pattern 58 is formed, an n-type impurity, such as phosphorus, is ion-implanted into the exposed surface of p-type well region, using layers 56 and pattern 58 as masks, to form ion-implanted region 60, shown in FIG. 3B. The dosage and accelerating energy of the phosphorus are selected in the same manner as in the ion implantation process of the previous embodiment. Thus, the conductivity type of the region 60 remains as p-type.

After region 60 is formed, pattern 58 is removed. The exposed surfaces of p-type and n-type well regions 52 and 54 are covered respectively with gate oxide films 62A and 62B of 200 Å thick, as shown in FIG. 3C. After films 62A and 62B are formed, phosphorus-doped polycrystalline silicon is entirely deposited on films 62A and 62B, thereby forming a phosphorus-doped polycrystalline silicon film (not shown). This polycrystalline silicon film is then patterned, the silicon film is selectively removed by the patterning, and part remains as gate electrodes 64A and 64B, as shown in FIG. 3C.

After gate electrodes 64A and 64B are formed, a photoresist pattern, not shown, is formed to cover the semiconductor structure on n-type well 54 side. Then, an n-type impurity, such as arsenic, is ion-implanted into the region 66 and p-type well region 52, using electrode 64A, layer 56, and the photoresist pattern as masks, and is activated to form n$^+$-type source and drain regions 66A and 68A, shown in FIG. 3C. Region 60 remains as channel region 60A between source and drain regions 66A and 68B. The above-mentioned photoresist pattern is removed after source and drain regions 66A and 68A are formed.

Next, another photoresist pattern (not shown) is formed to cover the semiconductor structure on the p-type well 52 side. Then, a p-type impurity, such as boron, is ion-implanted into n-type well region 54, using electrode 64B, layer 56, and the photoresist pattern as masks, and is activated to form p$^+$-type source and drain regions 66B and 68B, shown in FIG. 3C. The photoresist pattern is removed after source and drain regions 66B and 68B are formed. Thus, the formation of CMOS transistors is completed.

When the CMOS transistors are wired, and interlayer insulating film (not shown) is formed to cover the structure in the same manner as the previous embodiments, and is then patterned, thereby forming a wiring layer (not shown) disposed on the interlayer insulating film.

In the second embodiment described above, resist pattern 58 blocks the n-type impurity during the ion implantation for forming layer 60. Thus, the same advantages as those of the previous embodiments can be provided in the formation of the CMOS transistors.

In the second embodiment described above, the n-type impurity is ion-implanted only on the p-type well region 52 side, to form ion-implanted region 60. However, the present invention is not limited to this particular embodiment. In other words, a p-type impurity may be ion-implanted into n-type well region 54 in an additional step, so as to form an ion-implanted layer having the same role as that of layer 60.

Figure 4A:
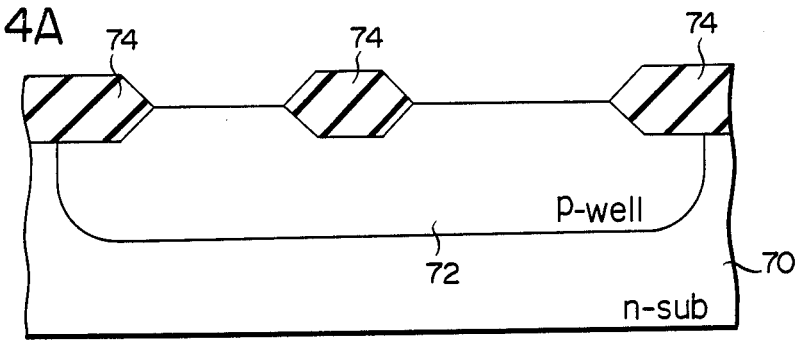

A third embodiment of the present invention will now be described with reference to FIGS. 4A to 4F. In this embodiment, memory cells for a dynamic RAM are formed. Each memory cell has a MOS transistor and a capacitor connected in series with the MOS transistor. FIGS. 4A to 4F show the steps in the manufacturing of the memory cells. FIG. 4D is a schematic top view of the completed memory cell; FIG. 4E and FIG. 4F respectively show sectional structures taken along lines I—I and II—II in FIG. 4D; and FIGS. 4A to 4C correspond to the sectional structure taken along line I—I in FIG. 4D.

In the manufacturing method, n-type silicon substrate 70 is prepared. P-type well region 72, shown in FIG. 4A, is formed by ion-implanting boron into the surface of substrate 70. The surface of region 72 is partly surrounded by field oxide layer 74 formed by a selective oxidation method, and each surrounded portion is used as an element region for a memory cell constituted by a MOS transistor and a MOS capacitor.

Figure 4B:
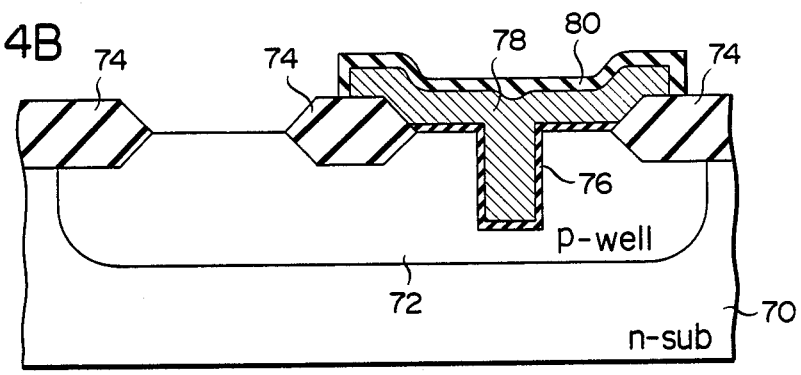

P-type well region 72 is opened to a depth of 2 μm by reactive ion etching, as shown in FIG. 4B. Then, oxide film 76 is formed on the exposed surface of p-type well region 72, as shown in FIG. 4B. After the formation of film 76, phosphorus-doped polycrystalline silicon is deposited on the entire semiconductor structure, thereby forming a phosphorus-doped polycrystalline silicon film (not shown). This silicon film is then patterned, and part remains as capacitor electrode 78, as shown in FIG. 4B. Electrode 78 forms a MOS capacitor with the opposed portion of region 72. Then, interlayer insulating film 80 is formed to entirely cover electrode 78.

Figure 4C:
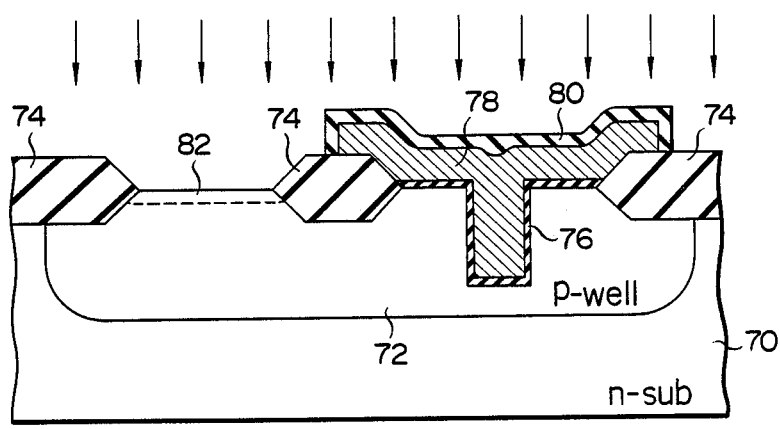
Figure 4D:
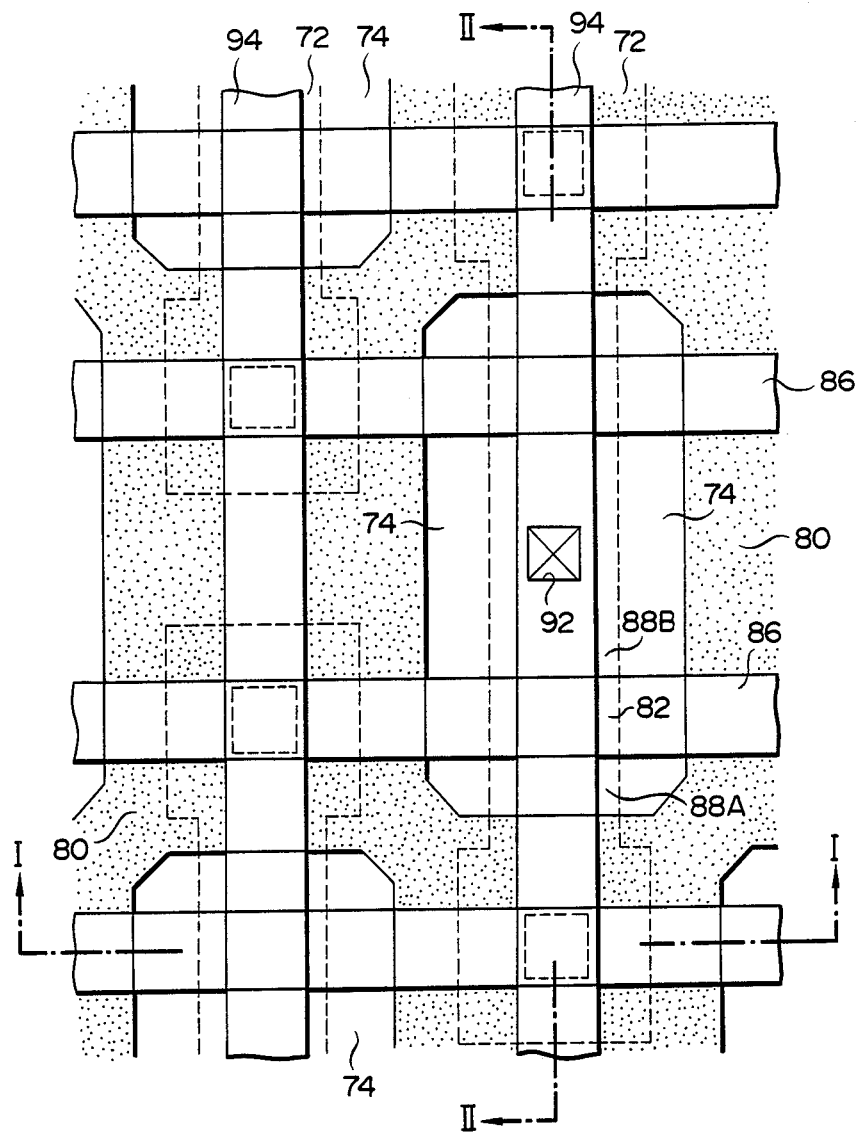

After the formation of film 80, phosphorus is ion-implanted into the surface of region 72, using film 80 and layer 74 as masks, as shown in FIG. 4C, to form ion-implanted region 82 in the same manner as the previous embodiments. Gate oxide film 84, shown in FIG. 4E, is formed to entirely cover layer 82. After film 84 is formed, phosphorus-doped polycrystalline silicon is deposited on the entire semiconductor structure, to form a polycrystalline silicon film (not shown). The silicon film is patterned, and part remains as a word line 86, as shown in FIG. 4E. Line 86 is used as a gate electrode on film 84.

After line 86 is formed, arsenic is ion-implanted into region 72, using electrode (or word line) 86, layer 74, and electrode 78 as masks, and is activated to form source and drain regions 88A and 88B. Then, interlayer insulating film 90 is deposited cover the entire semiconductor structure. Film 90 is selectively opened to form contact hole 92. After hole 92 is formed, a metal layer (not shown) is formed by depositing on film 90. The metal layer is selectively removed by patterning. Part of the metal layer is left as bit line 94 contracting with region 88B.

Thus, the formation of a memory cell for the dynamic RAM is completed.

According to the embodiment described above, similar advantages to those of the previous embodiments can be provided. In particular, when the MOS transistor and grooved MOS capacitor are formed in and on a single well region as in this embodiment, the following advantages can be also provided.

Generally, when groove MOS capacitors are formed in and on different p-type well regions 72, it is necessary to increase the impurity concentration of each p-type well region 72 (e.g., $1 \times 10^{17}$ cm$^{-3}$ or higher), so as to reduce the leakage current between the capacitors. On the other hand, when a MOS transistor is formed, it is necessary to reduce the impurity concentration of p-type well region 72 than that of the MOS capacitor (e.g., $3 \times 10^{16}$ cm$^{-3}$). In such a case, it is effective to channel ion implant, to form the MOS transistor after the grooved MOS capacitor is formed as in the third embodiment.

According to the method of manufacturing the semiconductor device of the invention as described above, the impurity concentration of the element region can be optimally maintained without decreasing the field insulating characteristics, to improve the element characteristics and to improve the microminiaturization of the elements.

What is claimed is:

1. A method of manufacturing a memory cell for a dynamic type random access memory, comprising:
    a first step of forming at least one well region of a first conductivity type in the surface of a semiconductor substrate;
    a second step of forming a field insulating layer surrounding part of a surface of said well region, as an element region;
    a third step of forming a groove in the surface of said well region;
    a fourth step of forming a capacitor electrode insulatively on the surface of said well region corresponding to said groove;
    a fifth step of forming a covering layer on said capacitor electrode;
    a sixth step of doping a predetermined amount of an impurity of the second conductivity type into the surface of said well region, with the use of said field insulating layer and covering layer as masks, so that said well region has a reduced carrier density in the vicinity of the impurity-doped surface, said predetermined amount of said impurity being in a range in which the conductivity type of said well region is not changed during manufacture;
    a seventh step of forming a gate electrode insulatively on the impurity-doped surface of said well region; and
    an eighth step of forming source and drain regions of the second conductivity type in the impurity-doped surface of said well region.

2. A method according to claim 1, wherein said sixth step of doping includes ion-implanting the impurity of the second conductivity type into the surface of said well region, with the use of said field insulating and covering layers.

3. A method according to claim 2, wherein said semiconductor substrate is of the second conductivity type

* * * * *